United States Patent
Yoon et al.

(10) Patent No.: US 8,522,172 B2
(45) Date of Patent: Aug. 27, 2013

(54) METHOD OF FORMING PHOTOMASK USING CALIBRATION PATTERN, AND PHOTOMASK HAVING CALIBRATION PATTERN

(75) Inventors: Young-keun Yoon, Yongin-si (KR); Hee-bom Kim, Hwaseong-si (KR); Myoung-soo Lee, Suwon-si (KR); Chan-uk Jeon, Seongnam-si (KR); Hak-seung Han, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 53 days.

(21) Appl. No.: 13/240,732

(22) Filed: Sep. 22, 2011

(65) Prior Publication Data
US 2012/0159405 A1    Jun. 21, 2012

(30) Foreign Application Priority Data

Dec. 17, 2010    (KR) .................... 10-2010-0129997

(51) Int. Cl.
*G06F 17/50*    (2006.01)
(52) U.S. Cl.
USPC ............... 716/56; 716/50; 716/51; 716/55
(58) Field of Classification Search
None
See application file for complete search history.

(56) References Cited

U.S. PATENT DOCUMENTS

| | | | |
|---|---|---|---|
| 6,689,625 B2 | 2/2004 | Inoue | |
| 7,488,933 B2* | 2/2009 | Ye et al. | 250/252.1 |
| 7,541,121 B2* | 6/2009 | Ziger | 430/30 |
| 7,820,341 B2* | 10/2010 | Laidig et al. | 430/5 |
| 8,161,421 B2* | 4/2012 | Viswanathan et al. | 716/53 |
| 2007/0201732 A1 | 8/2007 | Wahlsten | |
| 2008/0250380 A1 | 10/2008 | Kijima et al. | |
| 2009/0150849 A1* | 6/2009 | Lee et al. | 716/19 |

FOREIGN PATENT DOCUMENTS

| | | |
|---|---|---|
| JP | 2002-296754 A | 10/2002 |
| JP | 2008-256932 A | 10/2008 |
| KR | 10 2008-0085197 A | 9/2008 |
| KR | 10 2010-0001135 A | 1/2010 |

* cited by examiner

*Primary Examiner* — Leigh Garbowski
(74) *Attorney, Agent, or Firm* — Lee & Morse, P.C.

(57) ABSTRACT

A method of forming a photomask using a calibration pattern that may exactly transfer a desired pattern to a substrate. The method includes providing one-dimensional calibration design patterns each having first design measures and providing two-dimensional calibration design patterns each having second design measures; obtaining one-dimensional calibration measured patterns using the one-dimensional calibration design patterns and obtaining two-dimensional calibration measured patterns using the two-dimensional calibration design patterns; obtaining first measured measures of the one-dimensional calibration measured patterns and obtaining second measured measures of the two-dimensional calibration measured patterns; establishing a correlation between the first measured measures and the second measured measures; and converting a main measured measure of a main pattern into a corresponding one of the first measured measures using the correlation.

20 Claims, 8 Drawing Sheets

METHOD OF FORMING PHOTOMASK USING CALIBRATION PATTERN, AND PHOTOMASK HAVING CALIBRATION PATTERN

CROSS-REFERENCE TO RELATED APPLICATIONS

This application claims the benefit of Korean Patent Application No. 10-2010-0129997, filed on Dec. 17, 2010, in the Korean Intellectual Property Office, and entitled: "Method of Forming Photomask Using Calibration Pattern, and Photomask Having Calibration Pattern," which is incorporated by reference herein in its entirety.

BACKGROUND

1. Field

Embodiments relate to a method of forming a photomask, and more particularly, to a method of forming a photomask using a calibration pattern that may exactly transfer a desired pattern to a substrate.

2. Description of the Related Art

As semiconductor devices become more highly integrated, widths and intervals between patterns formed on a semiconductor substrate are decreasing, and patterns having an intricate two-dimensional shape are increasing. Thus, a technology for calculating a mean-to-target (MTT) of a pattern having a two-dimensional shape is required.

SUMMARY

One or more embodiments provide a method of forming a photomask using a calibration pattern that may exactly transfer a desired pattern to a substrate.

One or more embodiments provide a method of forming a photomask, the method comprising providing one-dimensional calibration design patterns each having first design measures and providing two-dimensional calibration design patterns each having second design measures, obtaining one-dimensional calibration measured patterns using the one-dimensional calibration design patterns and obtaining two-dimensional calibration measured patterns using the two-dimensional calibration design patterns, obtaining first measured measures of the one-dimensional calibration measured patterns and obtaining second measured measures of the two-dimensional calibration measured patterns, establishing a correlation between the first measured measures and the second measured measures, and converting a main measured measure of a main pattern into a corresponding one of the first measured measures using the correlation.

After converting the main measured measure of the main pattern into the corresponding one of the first measure measures, the method may include obtaining a mean-to-target (MTT) of the main pattern, and correcting the main pattern using the MTT of the main pattern.

Obtaining the MTT of the main pattern may include selecting the one-dimensional calibration measured pattern and the one-dimensional calibration design pattern based on the first measured measure into which the main measured measure of the main pattern is converted, calculating a difference between the first design measures of the one-dimensional calibration design pattern and the first measured measures of the one-dimensional calibration measured pattern, and establishing the difference as the MTT of the main pattern.

The first design measures and the second design measures may vary corresponding to each other.

Calculating the correlation may include calculating a correlation between square roots of the first measured measures and the second measured measures. The method as claimed in claim 1, wherein converting the main measured measure of the main pattern into the corresponding one of the first measured measures using the correlation includes measuring the main measured measure of the main pattern, substituting the main measured measure of the main pattern to the correlation as the second measured measures, and calculating the first measured measure corresponding to the main measured measure using the correlation.

Converting the main measured measure of the main pattern into the corresponding one of the first measured measures using the correlation may include measuring the main measured measure of the main pattern, selecting the two-dimensional calibration measured pattern having the second measured measure corresponding to the main measured measure of the main pattern, selecting the one-dimensional calibration measured pattern corresponding to the selected two-dimensional calibration measured pattern using the correlation, and converting the main measured measure into the first measured measure of the selected one-dimensional calibration measured pattern.

Selecting the two-dimensional calibration measured pattern having the second measured measure corresponding to the main measured measure of the main pattern may include selecting the two-dimensional calibration measured pattern having the second measured measure that is the same as the main measured measure.

Selecting the two-dimensional calibration measured pattern having the second measured measure corresponding to the main measured measure of the main pattern may include selecting the two-dimensional calibration measured pattern having the second measured measures that is proximal to the main measured measure.

The correlation may be a continuous function or a discontinuous relationship between the first measured measures and the second measured measures.

The first design measures may change by a constant amount.

The second design measures may change by a constant amount.

Converting the main measured measure into the first measured measure may include converting a square root of the main measured measure into the first measured measure.

Providing the one-dimensional calibration design patterns may include providing first one-dimensional calibration design patterns extending in a first direction and second one-dimensional calibration design patterns extending in a second direction, the first direction being at a predetermined angle with respect to the first direction.

One or more embodiments provide a method of forming a photomask, the method including calculating a correlation between a one-dimensional pattern and a two-dimensional pattern, and correcting the two-dimensional pattern using a mean-to-target (MTT) of the one-dimensional pattern obtained by the correlation.

One or more embodiments provide a method of forming a photomask, the method including obtaining first measurements of a one-dimensional calibration pattern including a plurality of one-dimensional designs, the plurality of one-dimensional designs being step-wise different from each other by a predetermined amount, obtaining second measurements of a two-dimensional calibration pattern including a plurality of two-dimensional designs, the plurality of two-dimensional designs being step-wise different from each other by the predetermined amount, determining a correlation between the first measurements and the second measurements, and converting a main measurement of a main pattern into a corresponding one of the first measurements based on the determined correlation.

Corresponding ones of the one-dimensional designs and the two-dimensional designs have a same length.

The one-dimensional designs may include at least one line and/or space pattern, and the two-dimensional designs include square patterns.

The predetermined amount may be a constant amount.

The plurality of one-dimensional designs may include first one-dimensional designs extending in a first direction, and second one-dimensional designs extending in a second direction, and the plurality of two-dimensional designs include portions extending in the first direction and portions extending in the second direction, the first direction being at a predetermined angle relative to the second direction.

One or more embodiments provide a photomask including a main pattern region in which a main pattern is formed, and a calibration pattern region disposed outside of the main pattern region, wherein the calibration pattern region area includes two-dimensional calibration patterns each having an area increasing with a constant variation, and being sequentially arranged according to the area, and one-dimensional calibration patterns each having a length increasing with a constant variation to correspond to the corresponding two-dimensional calibration pattern.

Each of the one-dimensional calibration patterns may include a first one-dimensional calibration design pattern and a second one-dimensional calibration design pattern, wherein the first one-dimensional calibration design patterns extend in a first direction and the second one-dimensional calibration design patterns extend in a second direction having a predetermined angle with respect to the first direction.

BRIEF DESCRIPTION OF THE DRAWINGS

Features will become more apparent to those of ordinary skill in the art by describing in detail exemplary embodiments with reference to the attached drawings, in which.

DETAILED DESCRIPTION

Figure 1:
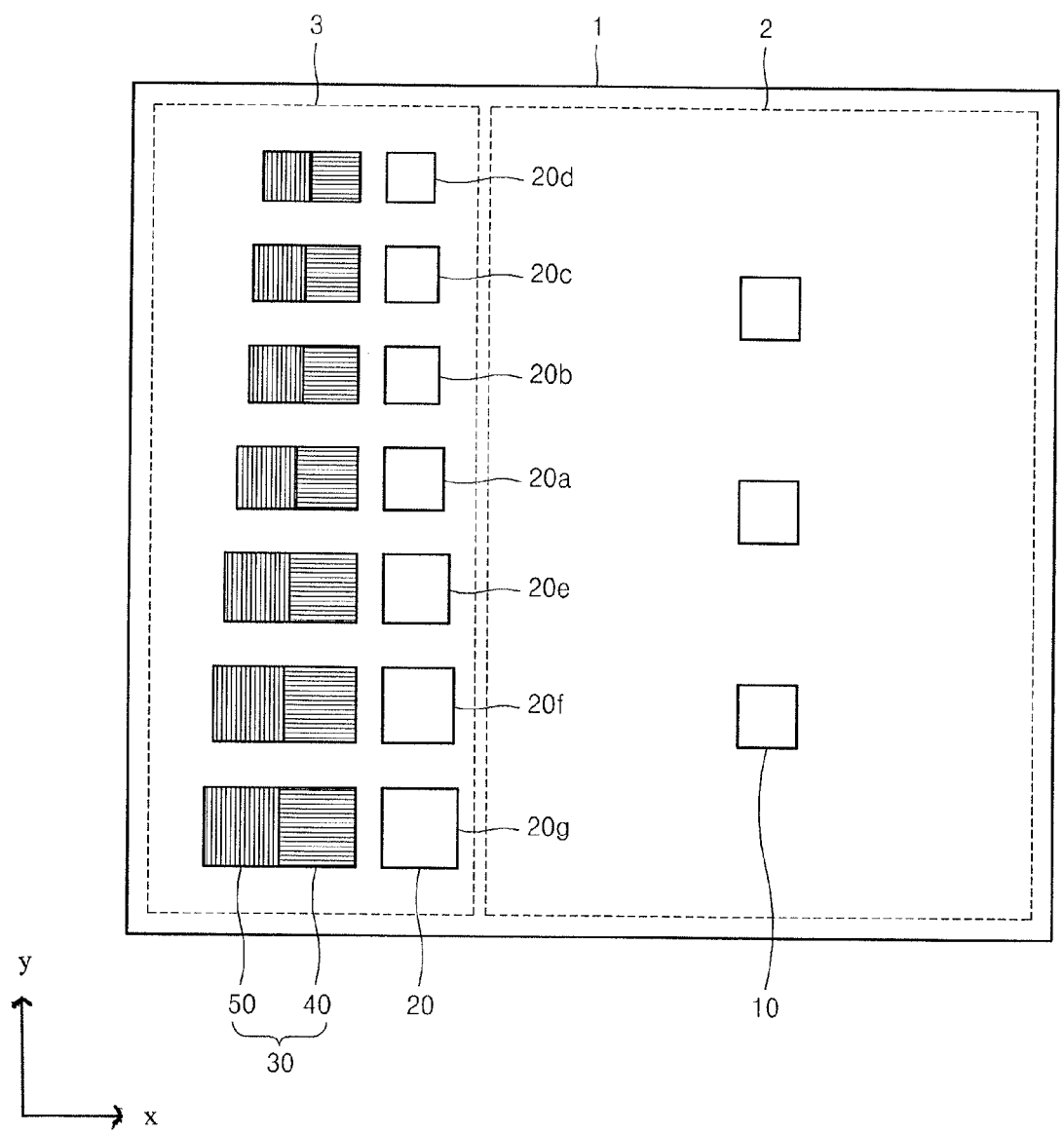
FIG. 1 illustrates a top plane view of an exemplary embodiment of a photomask.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a top plane view of an exemplary embodiment of a photomask 1. Referring to FIG. 1, the photomask 1 may include a main pattern area 2, and a calibration pattern area 3.

Patterns for forming microelectronic devices, e.g., a transistor, may be formed in the main pattern area 2. In the description of exemplary embodiments herein, pattern refers to a main pattern 10. The main pattern 10 may be included in a photomask layout, and may have any shape, e.g., a polygonal shape, a curved shape, a combination thereof, etc. More particularly, e.g., the main pattern 10 may have a shape such as a triangular shape, a rectangular shape, a square shape, a parallelogram shape, a diamond shape, a trapezoid shape, a semicircular shape, a circular shape, an oval shape, a combination thereof, etc.

The calibration pattern area 3 may be disposed outside of the main pattern area 2. The calibration pattern area 3 may include a plurality of two-dimensional calibration design patterns 20, and a plurality of one-dimensional calibration design patterns 30. In the exemplary embodiment of FIG. 1, the one-dimensional calibration design patterns 30 are arranged in a column of an array and the two-dimensional calibration design patterns 20 are arranged in another column of the array.

Herein, a one-dimensional pattern may refer to a pattern that extends substantially along a one direction, e.g., a pattern that has a significantly longer length than width such as a line, a line-space-line-space pattern, etc. Herein, a two-dimensional pattern may refer to a pattern that extends along two-directions, e.g., a square, rectangle, etc. More particularly, e.g., a two-dimensional pattern may refer to a pattern having a length and width of a same and/or substantially same size, e.g., a square general contact hole pattern.

Referring to FIG. 1, areas of the two-dimensional calibration design patterns 20 may respectively increase by, e.g., a constant amount. The two-dimensional calibration design patterns 20 may be sequentially arranged according to area size, e.g., smallest to largest area. A plurality, e.g., five, twenty-five, etc., of the two-dimensional calibration design patterns 20 may be disposed in an array, e.g., along a first direction (e.g., y-direction). More particularly, e.g., referring to the exemplary embodiment of FIG. 1, the calibration pattern area 3 may include a plurality of two dimensional calibration design patterns, e.g., 20a, 20b, 20c, 20d, 20e, 20f, 20g. In the exemplary embodiment of FIG. 1, each of the two dimensional calibration design patterns 20a through 20g has a general square shape such that a width, e.g., along y-direction, is equal to and/or substantially equal to a length, e.g., along a second direction (e.g., x-direction) thereof, but respective areas of the two dimensional calibration design patterns 20a through 20g may be different. For example, the two-dimensional calibration design pattern 20a may be disposed in the middle of the array and a size of each side thereof may be 100 nm in length (i.e., width=100 nm and length=100 nm) such that an area of the two-dimensional calibration design pattern 20a may be 10,000 nm$^2$. Respective lengths and/or widths of the two-dimensional calibration design patterns 20b, 20c, 20d disposed above the two-dimensional calibration design pattern 20a along the y-direction may gradually vary, e.g., may gradually decrease by a constant amount. More particularly, e.g., lengths and widths of the two-dimensional calibration design patterns 20b, 20c, 20d may be 95 nm, 90 nm, 85 nm, respectively, and thus, areas of the two-dimensional calibration design patterns 20b, 20c, 20d may be 9,025 nm$^2$, 8,100 nm$^2$, 7,225 nm$^2$, respectively. Further, respective lengths and/or widths of the two-dimensional calibration design patterns 20e, 20f, 20g disposed below the two-dimensional calibration design pattern 20a relative to the y-direction may gradually vary, e.g., may gradually increase by the constant amount. More particularly, e.g., lengths and widths of the two-dimensional calibration design patterns 20d, 20f, 20g may be 105 nm, 110 nm, 115 nm, respectively, and thus, areas of the two-dimensional calibration design patterns 20e, 20f, 20g may be 11,025 nm$^2$, 12,100 nm$^2$, 13,225 nm$^2$, respectively.

Further, e.g., each of the one-dimensional calibration design patterns 30 may include a plurality of design patterns. More particularly, e.g., each of the one-dimensional calibration design patterns 30 may include a first one-dimensional calibration design pattern 40 and a second one-dimensional calibration design pattern 50. Further, in the exemplary embodiment of FIG. 1, respective ones of the first one-dimensional calibration design patterns 40 and the second one-dimensional calibration design patterns 50 are adjacent to each other. Also, in the exemplary embodiment of FIG. 1, respective ones of the first one-dimensional calibration design patterns 40, the second one-dimensional calibration design patterns 50, and the two-dimensional calibration design patterns are aligned along the x-direction so as to form rows of the array.

Referring to FIG. 1, each of the first one-dimensional calibration design patterns 40 and each of the second one-dimensional calibration design patterns 50 may correspond to a general square shape as defined, e.g., by one or more lines and spaces. More particularly, e.g., each of the first one-dimensional calibration design patterns 40 may include one or more lines extending in the second direction, e.g., x-direction, and the second one-dimensional calibration design patterns 50 may include one or more lines extending in the first direction, e.g., y-direction. The first direction may be at a predetermined angle relative to the second direction, e.g., the first direction may be perpendicular to the second direction. In one or more embodiments, the first one-dimensional calibration design patterns 40 may substantially and/or completely correspond to the second one-dimensional calibration design patterns 50, but rotated relative to each other, so as to extend along different directions (e.g., x-direction, y-direction, respectively).

Referring to FIG. 1, respective lengths and/or widths of each of the one-dimensional calibration design patterns 30 may vary, e.g., increase, along to the y-direction. More particularly, respective lengths (x-direction) and/or widths (y-direction) of the one-dimensional calibration design patterns 30 may increase by a constant amount relative to the y-direction. Further, a dimension, e.g., respective lengths (x-direction) of lines and/or spaces in the one-dimensional calibration design patterns 30 may vary, e.g., relative to a direction, e.g., the y-direction. In the exemplary embodiment of FIG. 1, lengths and widths of the one-dimensional calibration design patterns 30 decrease upward along the y-direction. More particularly, in the exemplary embodiment of FIG. 1, lengths and/or widths of the first one-dimensional calibration design patterns 40 and the second one-dimensional calibration design patterns 50 decrease by a constant amount upward along the y-direction so as to correspond to the lengths and/or widths of corresponding ones of the two-dimensional calibration design patterns 20 aligned therewith along the x-direction. Further, in the exemplary embodiment of FIG. 1, areas of the one-dimensional calibration design patterns 30, e.g., the first one-dimensional calibration design patterns 40 and/or the second one-dimensional calibration design patterns 50, may vary, e.g., respectively increase by a constant amount, relative to the y-direction. The one-dimensional calibration design patterns 30 may be sequentially arranged according to area size, e.g., smallest to largest area. Referring to FIG. 1, respective widths (y-direction) of each of the one-dimensional calibration patterns 30 may be different from respective lengths (x-direction) thereof.

Figure 2:
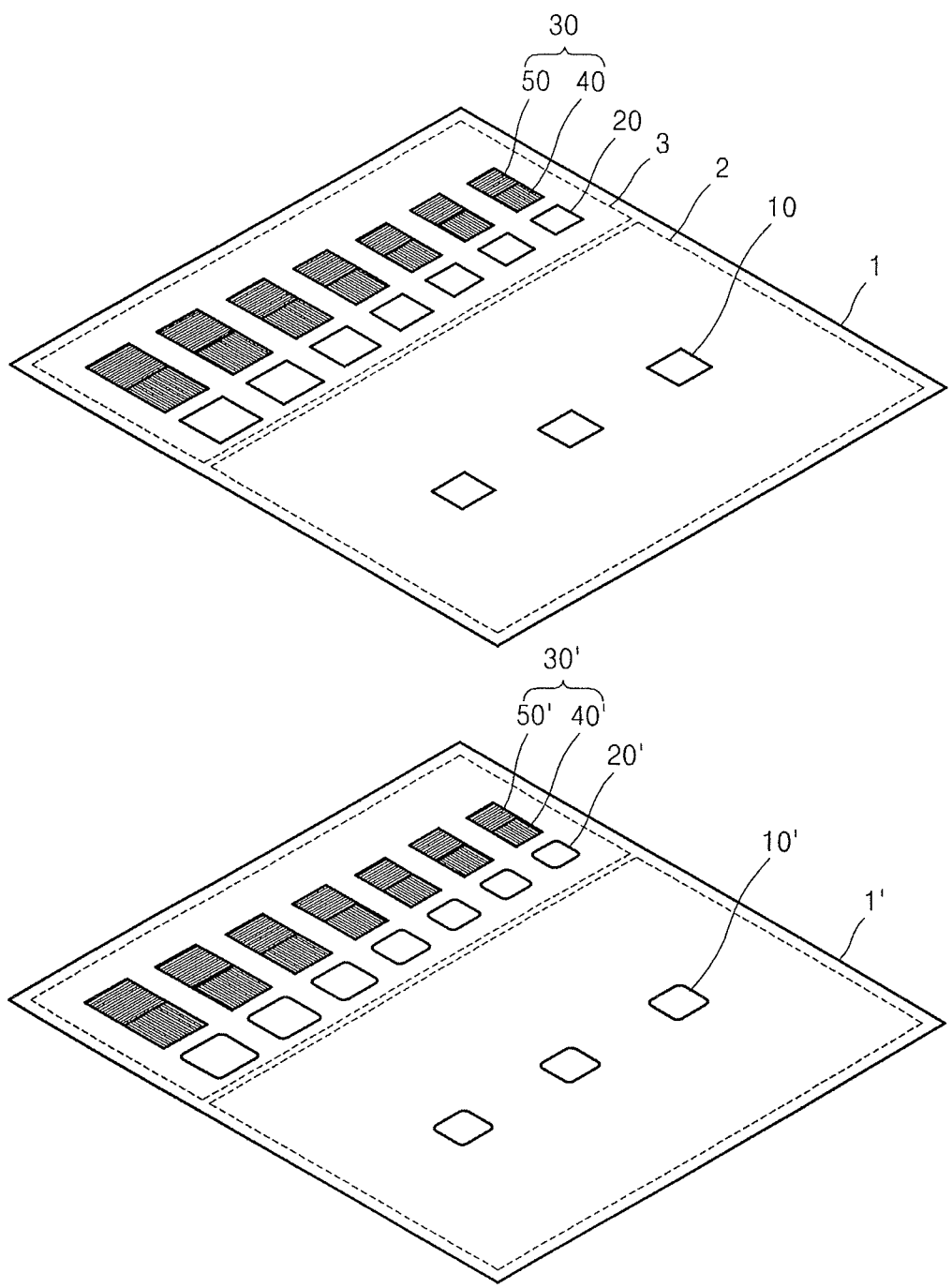
FIG. 2 illustrates a schematic diagram patterns formed on a corresponding surface using the photomask of FIG. 1.

FIG. 2 illustrates a schematic diagram patterns formed on a corresponding surface 1' using the photomask 1 of FIG. 1.

Referring to FIG. 2, actual patterns are formed on a corresponding surface 1' in accordance with the main pattern 10, the two-dimensional calibration design patterns 20, and the one-dimensional calibration design patterns 30 of the photomask 1. The actual patterns may be photoresist patterns, hard mask patterns, aerial image emulating patterns, etc. The photoresist patterns may be patterns formed by using a photoresist material that is generally used in the art. The hard mask patterns may include various materials, e.g., silicon oxide, silicon nitride, etc. The aerial image emulating patterns generally refer to an image formed on a photoresist. The aerial image emulating patterns are formed by an aerial image emulator without undergoing an exposure process. The aerial image emulator may be an aerial image measurement system (AIMS) made by Carl Zeiss AG or a mask inspection tool.

Herein, the actual pattern refers to a measured pattern. Referring to FIG. 2, a main measured pattern 10', a plurality of two-dimensional calibration measured patterns 20', and a plurality of one-dimensional calibration measured patterns 30' may be formed corresponding to the main pattern 10, the two-dimensional calibration design patterns 20, and the one-dimensional calibration design patterns 30, respectively. Each of the one-dimensional calibration measured patterns 30' may include a first one-dimensional calibration measured pattern 40' corresponding to the first one-dimensional calibration design pattern 40 and a second one-dimensional calibration measured pattern 50' corresponding to the second one-dimensional calibration design pattern 50'.

FIGS. 3 through 6 illustrate diagrams of exemplary relationships between exemplary embodiments of the two-dimensional calibration design pattern 20 and the one-dimensional calibration design pattern 30 of FIG. 1.

Figure 3:
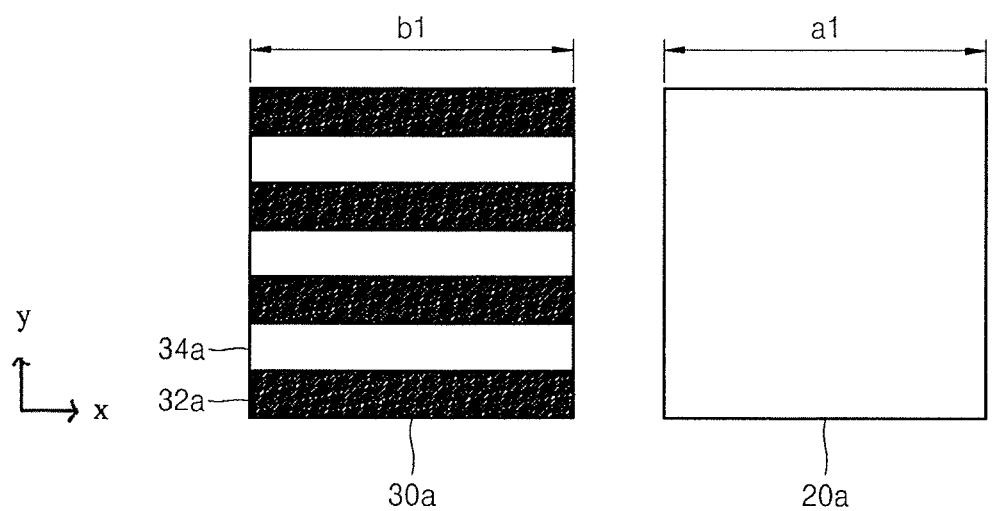
FIGS. 3 through 6 illustrate diagrams of exemplary relationships between exemplary embodiments of the two-dimensional calibration design pattern and the one-dimensional calibration design pattern of FIG. 1.

Referring to FIG. 3, in one or more embodiments, a one-dimensional calibration design pattern 30a and a two-dimensional calibration design pattern 20a have a relationship in which a length a1 of one side of the two-dimensional calibration design pattern 20a is equal to a length b1 of the one-dimensional calibration design pattern 30a. The length b1 of the one-dimensional calibration design pattern 30a may be a length of a line 32a or a length of a space 34a.

Figure 4:
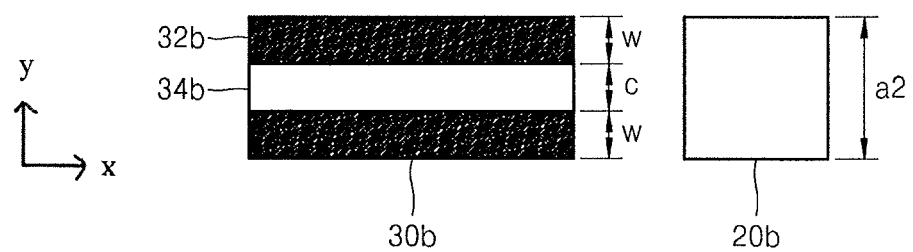

Referring to FIG. 4, in one or more embodiments, a one-dimensional calibration design pattern 30b and a two-dimensional calibration design pattern 20b have a relationship in which a length (or width) a2 of one side of the two-dimensional calibration design pattern 20b is equal to a sum of widths of all lines and spaces of the one-dimensional calibration design pattern 30b. More particularly, e.g., in the exemplary embodiment of FIG. 4, the length (or width) a2 of the two-dimensional calibration design pattern 20b may equal the sum b1 of widths w of each of the lines 32b and a width c of a space 34b between the lines 32b of the one-dimensional calibration design pattern 30b, that is, b1=2w+c. The sum b1 may include various numbers of lines 32 and spaces 34 within the one-dimensional calibration design pattern 30b.

Figure 5:
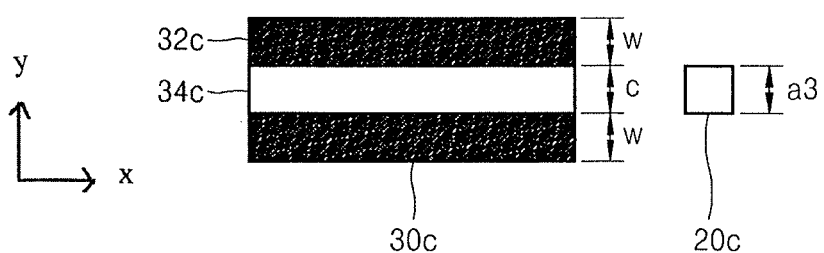

Referring to FIG. 5, in one or more embodiments, a one-dimensional calibration design pattern 30c and a two-dimensional calibration design pattern 20c have a relationship in which a length (or width) a3 of one side of the two-dimensional calibration design pattern 20c is equal to a width c of a space 34c of the one-dimensional calibration design pattern 30c.

Figure 6:
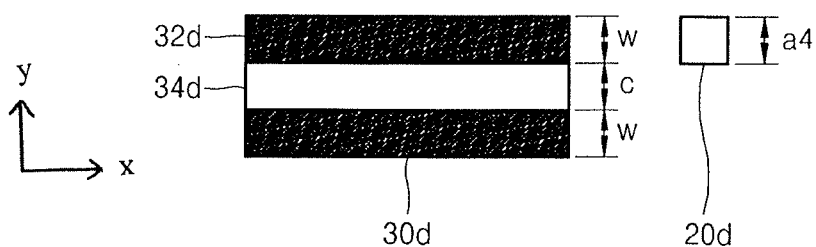

Referring to FIG. 6, in one or more embodiments, a one-dimensional calibration design pattern 30d and a two-dimensional calibration design pattern 20d have a relationship in which a length (or width) a4 of one side of a two-dimensional calibration design pattern 20d is equal to a width w of a line 32d of the one-dimensional calibration design pattern 30d.

Respective areas of the two-dimensional calibration design patterns 20 described with reference to FIGS. 3 through 6 may change with a constant variation as described above with regard to FIG. 1, and respective sizes, e.g., widths and/or lengths, of the one-dimensional calibration design pattern 30 may change in correspondence thereto.

Figure 7:
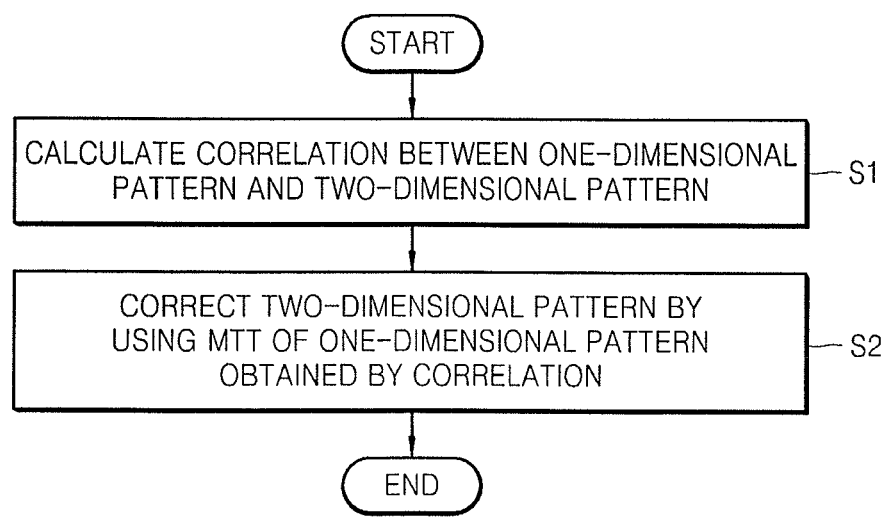
FIG. 7 illustrates a flowchart of an exemplary embodiment of a method of forming a photomask.

FIG. 7 illustrates a flowchart of an exemplary embodiment of a method of forming a photomask.

Referring to FIG. 7, the method of forming the photomask may include calculating a correlation between a one-dimensional pattern and a two-dimensional pattern (S1) and correcting the two-dimensional pattern using a mean-to-target (MTT) of the one-dimensional pattern based on the correlation (S2).

Figure 8:
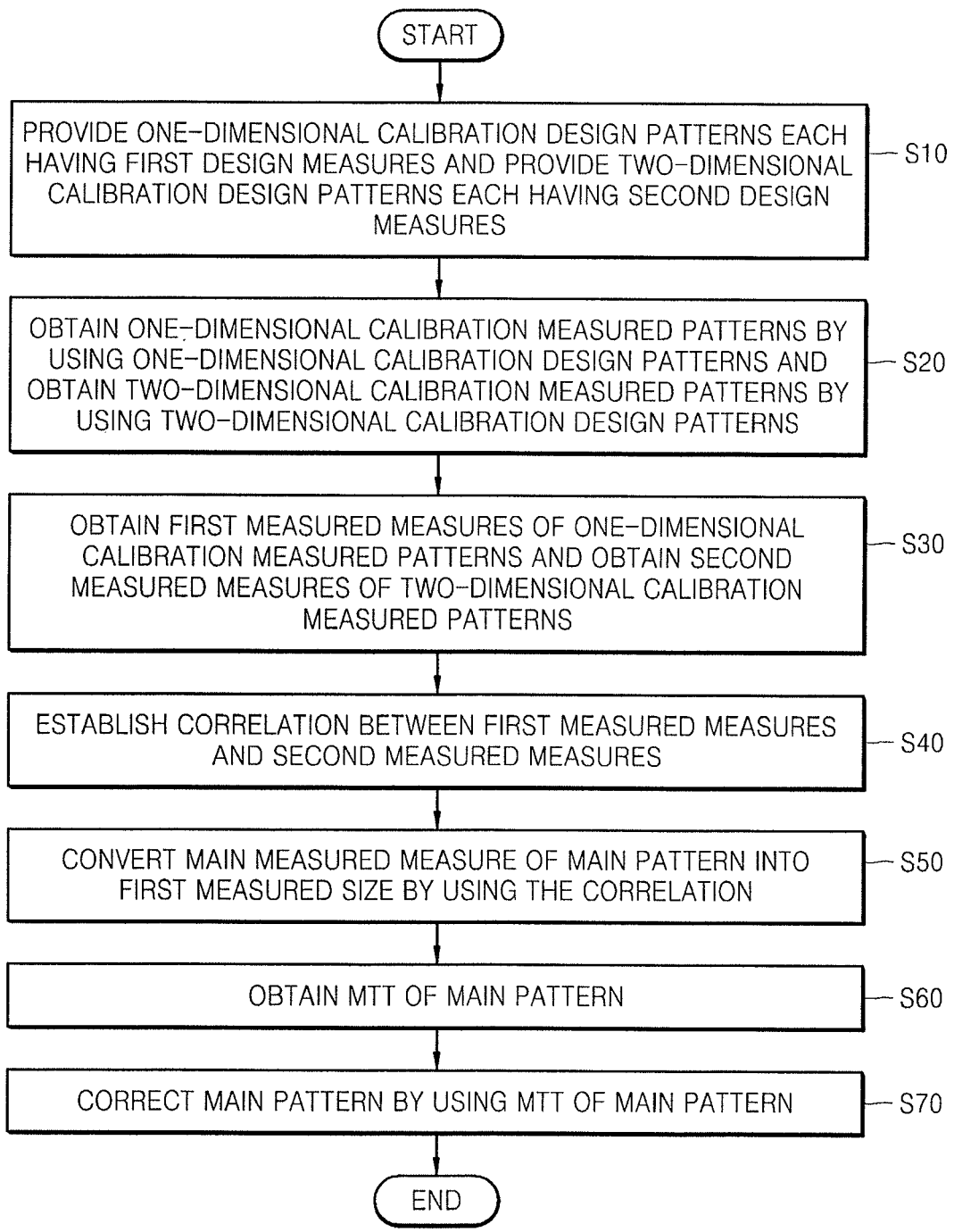
FIG. 8 illustrates a flowchart of an exemplary embodiment of a method of forming a photomask.

FIG. 8 illustrates a flowchart of an exemplary embodiment of a method of forming a photomask.

Referring to FIG. 8, one-dimensional calibration design patterns each having first design measures and two-dimensional calibration design patterns each having second design measures are provided (S10).

The one-dimensional calibration design patterns may be linear patterns, for example, line-and-space patterns. In one or more embodiments, the first design measures may have a dimension, e.g., length dimension, that may change by a constant variable. In addition, as illustrated in FIG. 1, the one-dimensional calibration design patterns may provide the first one-dimensional calibration design patterns 40 extending in the second direction, e.g., x-direction, and the second one-dimensional calibration design patterns 50 extending in the first direction, e.g., y-direction, at a predetermined angle, e.g., 90 degrees, with respect to the first direction.

Each of the two-dimensional calibration design patterns may have a triangular shape, a rectangular shape, a square shape, a parallelogram shape, a diamond shape, a trapezoid shape, a semicircular shape, a circular shape, an oval shape, a combination thereof, etc. Also, the second design measures may have an area dimension that may change with a constant variation.

The first design measures and the second design measures may correspond as described with reference to FIGS. 3 through 6. The first design measures may be, for example, the length b1 of the one-dimensional calibration design pattern 30a illustrated in FIG. 3, the sum b2 of the widths w of the lines 32b of the one-dimensional calibration design pattern 30b and the width c of the space 34b illustrated in FIG. 4, the width c of the space 34c of the one-dimensional calibration design pattern 30c illustrated in FIG. 5, or the width d of the line 32d of the one-dimensional calibration design pattern 30d illustrated in FIG. 6. Also, the second design measures may be, for example, an area "a1×a1" of the two-dimensional calibration design pattern 20a illustrated in FIG. 3, an area "a2×a2" of the two-dimensional calibration design pattern 20b illustrated in FIG. 4, an area "a3×a3" of the two-dimensional calibration design pattern 20c illustrated in FIG. 5, or an area "a4×a4" of the two-dimensional calibration design pattern 20d illustrated in FIG. 6.

Referring to FIG. 8, one-dimensional calibration measured patterns may be obtained using the one-dimensional calibration design patterns, and two-dimensional calibration measured patterns may be obtained by using the two-dimensional calibration design patterns (S20).

Referring to FIG. 8, first measured measures of the one-dimensional calibration measured patterns are obtained, and second measured measures of the two-dimensional calibration measured patterns may then be obtained (S30). The first measured measures may correspond to the first design measures, and the second measured measures may correspond to the second design measures. In general, the first measured measures and the second measured measures may change relative to values of the first design measures and the second design measures, and the respective values of the first measured measures and the second measured measures may decrease or increase.

In this regard, the first measured measure may have a length dimension. For example, the first measured measure may be a measure of the one-dimensional calibration measured pattern corresponding to the length b1 of the one-dimensional calibration design pattern 30a illustrated in FIG. 3. Alternatively, the first measured measure may be a measure of the one-dimensional calibration measured pattern corresponding to the sum b2 of the widths w of the line 32b and the width c of the space 34b of the one-dimensional calibration design pattern 30b illustrated in FIG. 4. Alternatively, the first measured measure may be a measure of the one-dimensional calibration measured pattern corresponding to the width c of the space 34c of the one-dimensional calibration design pattern 30c illustrated in FIG. 5. Alternatively, the first measured measure may be a measure of the one-dimensional calibration measured pattern corresponding to the width c of the line 32d of the one-dimensional calibration design pattern 30d illustrated in FIG. 6. The above-described methods of measuring the first measured measure are well known to one of ordinary skill in the art. For example, a method of dividing the one-dimensional calibration measured pattern into a plurality of pixels and counting the number of pixels corresponding to the first measured measure is used.

In one or more embodiments, the second measured measure may have an area dimension. For example, the second measured measure may be a measure of the two-dimensional calibration measured pattern corresponding to the area "a1×a1" of the two-dimensional calibration design pattern 20a illustrated in FIG. 3. Alternatively, the second measured measure may be a measure of the two-dimensional calibration measured pattern corresponding to the area "a2×a2" of the two-dimensional calibration design pattern 20b illustrated in FIG. 4. Alternatively, the second measured measure may be a measure of the two-dimensional calibration measured pattern corresponding to the area "a3×a3" of the two-dimensional calibration design pattern 20c illustrated in FIG. 5. Alternatively, the second measured measure may be a measure of the two-dimensional calibration measured pattern corresponding to the area "a4×a4" of the two-dimensional calibration design pattern 20d illustrated in FIG. 6. The above-described methods of measuring the second measured measure are well known to one of ordinary skill in the art. For example, a method of dividing the two-dimensional calibration measured pattern into a plurality of pixels and counting the number of pixels corresponding to the second measured measure may be used.

Referring to FIG. 8, a correlation between the first measured measures and the second measured measures may then be established (S40). The correlation may be a correlation between square roots of the first measured measures and the second measured measures represented by an area. The second measured measures may be a continuous function of the first measured measure or there may be a discontinuous relationship between the first measured measures and the second measured measures.

Referring to FIG. 8, a main measured measure of a main pattern may be converted into the first measured measure by using the correlation (S50). The main pattern may include a main design pattern and a main measured pattern corresponding to the main design pattern as illustrated in FIGS. 1 and 2. The main pattern may be, e.g., a one-dimensional pattern, a two-dimensional pattern. One or more embodiments may provide a method of forming a photomask including a main pattern that is a two-dimensional pattern. The converting operation will be described with reference to FIGS. 9 and 10.

Referring to FIG. 8, a mean-to-target (MTT) of the main pattern may then be obtained (S60), and the main pattern may be corrected using the MTT of the main pattern (S70). An exemplary method of obtaining of the MTT will be described with reference to FIG. 11.

Figure 9:
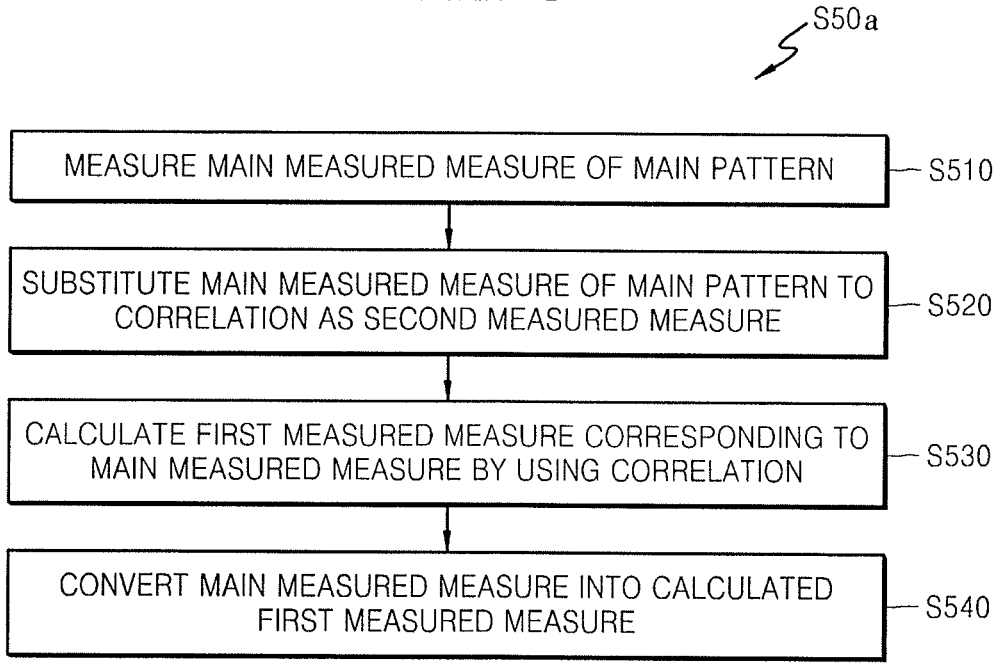
FIGS. 9 and 10 illustrate flowcharts of exemplary embodiments of a conversion operation of FIG. 8.
Figure 10:
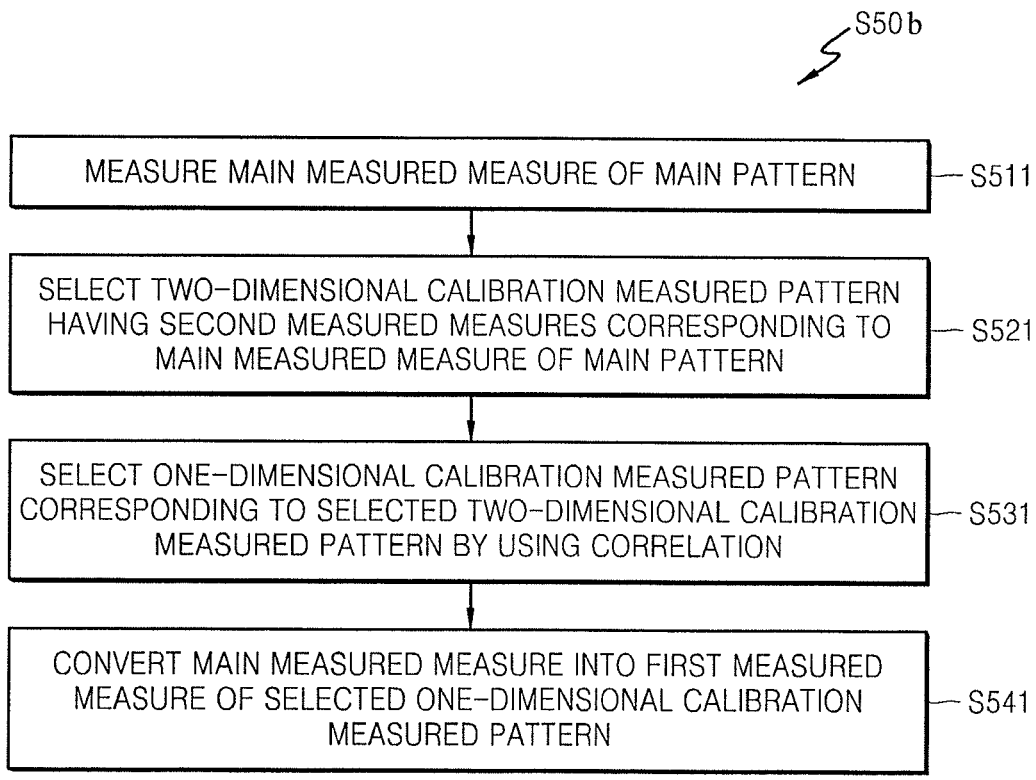

FIGS. 9 and 10 illustrated flowcharts of exemplary embodiments of the converting operation (S50a), (S50b) of FIG. 8.

Referring to FIG. 9, in one or more embodiments, converting the main measured measure of the main pattern into the first measured measure using the correlation (S50a) may include the following operations.

Referring to FIG. 9, the main measured measure of the main pattern, that is, the main measured pattern, may be obtained (S510). The main pattern may be a two-dimensional pattern, and the main measured measure may have an area dimension. Methods of measuring the main measured measure are well known to one of ordinary skill in the art. For example, a method of dividing the main pattern into a plurality of pixels and counting the number of pixels corresponding to the second measured measures may be used. The main measured measure of the main pattern may then be substituted in the correlation with the second measured measures (S520). In this regard, a square root of the main measured measure may be substituted in the correlation calculation. The first measured measure corresponding to the main measured measure may then be calculated using the correlation (S530). Thus, the main measured measure may be converted into the calculated first measured measure (S540). This method may be used when the correlation is a continuous function between the first measured measures and the second measured measures.

Referring to FIG. 10, in one or more other embodiments, converting the main measured measure of the main pattern into the first measured measure using the correlation (S50b) may include the following operations.

The main measured measure of the main pattern is measured (S511). The two-dimensional calibration measured pattern having the second measured measures corresponding to the main measured measure of the main pattern may be selected (S521). In this regard, the two-dimensional calibration measured pattern having the second measured measure that is the same as the main measured measure of the main pattern may be selected. Alternatively, the two-dimensional calibration measured pattern having the second measured measure that is proximal to the main measured measure of the main pattern may be selected. The one-dimensional calibration measured pattern corresponding to the selected two-dimensional calibration measured pattern may be selected using the correlation (S531), and thus, the main measured measure may be converted into the first measured measure of the selected one-dimensional calibration measured pattern (S541). This method may be used when the correlation is a discontinuous relationship between the first measured measures and the second measured measures.

Figure 11:
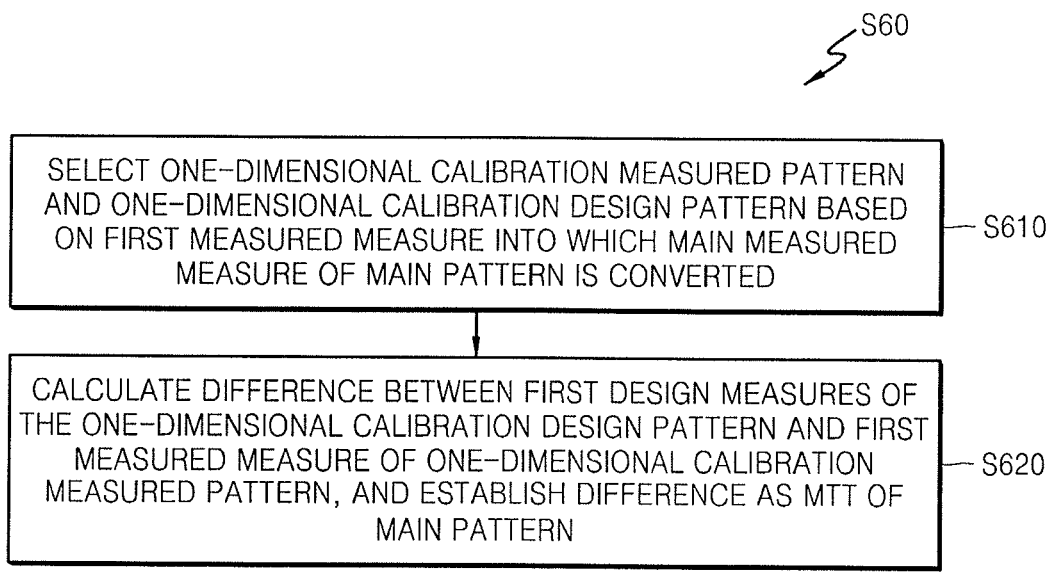
FIG. 11 illustrates a flowchart of an exemplary embodiment of an MTT obtaining operation of FIG. 8.

FIG. 11 illustrates a flowchart of an exemplary embodiment of obtaining the MTT of the main pattern.

Referring to FIG. 11, obtaining the MTT of the main pattern may include the following operations.

The one-dimensional calibration measured pattern and the one-dimensional calibration design pattern may be selected based on the first measured measure according to which the main measured measure of the main pattern is converted (S610). Then, a difference between the first design measures of the one-dimensional calibration design pattern and the first measured measure of the one-dimensional calibration measured pattern may be calculated, and a difference may be established as the MTT of the main pattern (S620).

Figure 12:
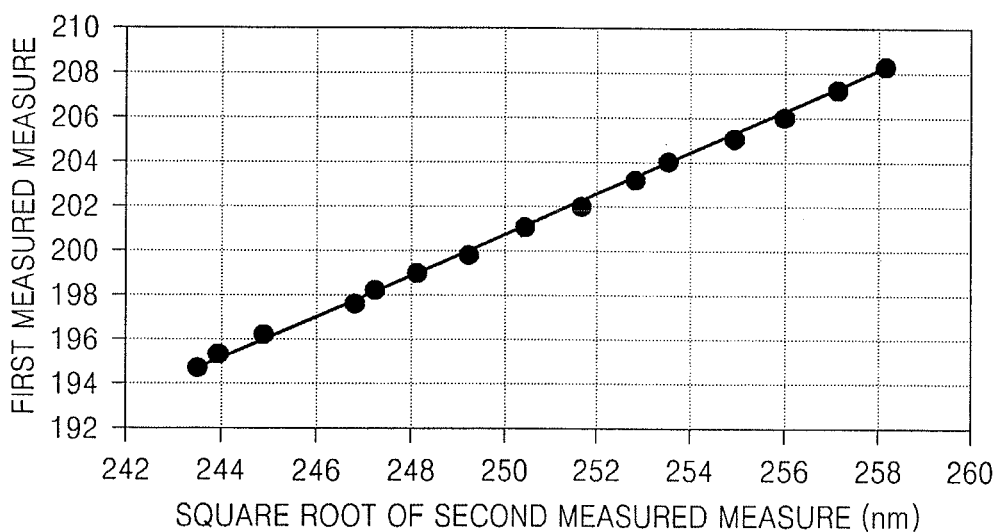
FIG. 12 illustrates a graph of a correlation between first measured measures and second measured measures according to an exemplary embodiment.

FIG. 12 illustrates a graph of a correlation between the first measured measures and the second measured measures, according to an exemplary embodiment.

FIG. 12 illustrates a correlation between square roots of the second measured measures and the first measured measures. Circles illustrated in FIG. 12 show values obtained by setting square roots of the areas of the two-dimensional calibration measured patterns formed by setting the two-dimensional calibration design patterns of FIG. 1 as x-axis values and by setting measured measures of the one-dimensional calibration measured patterns formed by the one-dimensional calibration design patterns corresponding to the two-dimensional calibration design patterns as y-axis values. In the exemplary embodiment of FIG. 12, each of the circles corresponds to one of the two-dimensional calibration design patterns, e.g., fifteen circles corresponding to fifteen two-dimensional calibration design patterns are illustrated. When the correlation is a discontinuous relationship, only values corresponding to the circles may be used. However, when the correlation is a continuous function, all values corresponding to a proximal line of a least square method with respect to the circles may be used.

Figure 13:
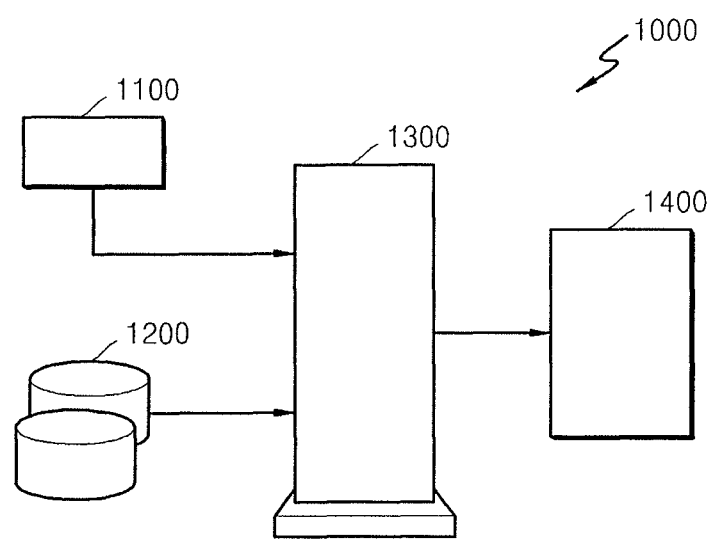
FIG. 13 illustrates a schematic diagram of an exemplary embodiment of an imaging system adapted to form a photomask according to an embodiment of the inventive concept.

FIG. 13 illustrates a schematic diagram of an exemplary embodiment of an imaging system 1000 for executing a method of forming a photomask, according to an embodiment of the inventive concept.

Referring to FIG. 13, a computer system 1300 for executing a method of forming a photomask may be a general-use workstation. The computer system 1300 may be a stand-alone type, a network type computer system, etc. The computer system 1300 may include a single processor or a multiprocessor for measurements. Also, the computer system 1300 may be a parallel-processing computer system.

The computer system 1300 may execute a series of executable commands, which are stored in a program storage medium 1100, for example, a compact disk (CD) or a digital video disk (DVD), or received via wired/wireless communication networks, such as the Internet. The computer system 1300 may receive a file including information regarding design patterns or photomask layouts from a database regarding the above-described design patterns or a photomask layout file storage 1200, for example, a database or any other storage medium, and may execute a command to read the file. The computer system 1300 may perform a process of calculating an MTT or a process of correcting a photomask using the measured MTT according to one or more embodiments on a design pattern or a photomask layout and may generate a file including information regarding the performed process. Then, the computer system 1300 may perform a comparison/inspection process to check if a desired photomask layout is formed, and may transmit the photomask layout to a mask recording apparatus 1400 to enable the manufacture of a photomask.

The imaging system 1000 may include a provision mechanism for providing one-dimensional calibration design patterns each having first design measures and two-dimensional calibration design patterns each having second design measures, a measured pattern obtainment mechanism for obtaining one-dimensional calibration measured patterns by using the one-dimensional calibration design patterns and obtaining two-dimensional calibration measured patterns by using the two-dimensional calibration design patterns, a measured measure obtainment mechanism for obtaining first measured measures of the one-dimensional calibration measured patterns and obtaining second measured measures of the two-dimensional calibration measured patterns, a correlation establishment mechanism for establishing a correlation between the first measured measures and the second measured measures, a conversion mechanism for converting a main measured measure of a main pattern into the first measured measure using the correlation, an MTT obtainment mechanism for obtaining an MTT of the main pattern, and a correction mechanism for correcting the main pattern using the MTT of the main pattern.

Features may be embodied as non-transitory computer-readable codes on a computer readable recording medium. A computer-readable recording medium may be any data storage device that can store programs or data that may be thereafter read by a computer system. Examples of the computer-readable recording medium include read-only memory (ROM), random-access memory (RAM), CD-ROMs, magnetic tapes, hard disks, floppy disks, flash memory, optical data storage devices, etc. Here, a program stored in a recording medium may be expressed in a series of instructions used directly or indirectly within a device with a data processing capability, such as, computers. Thus, a term "computer" involves all devices with data processing capability in which a particular function is performed according to a program using a memory, input/output devices, and arithmetic logics.

A method of forming a photomask may include providing one-dimensional calibration design patterns each having first design measures and two-dimensional calibration design patterns each having second design measures, obtaining one-dimensional calibration measured patterns by using the one-dimensional calibration design patterns, obtaining two-dimensional calibration measured patterns by using the two-dimensional calibration design patterns, obtaining first measured measures of the one-dimensional calibration measured patterns, obtaining second measured measures of the two-dimensional calibration measured patterns, establishing a correlation between the first measured measures and the second measured measures, converting a main measured measure of a main pattern into the first measured measure by using the correlation, obtaining an MTT of the main pattern, and correcting the main pattern by using the MTT of the main pattern. The recording medium may store programmed commands enabling each the above-described operations to be performed when the method of forming a photomask is executed in a computer.

The foregoing is illustrative of exemplary embodiments and is not to be construed as limiting thereof. Although exemplary embodiments have been described, those of ordinary skill in the art will readily appreciate that many modifications are possible in the exemplary embodiments without materially departing from the novel teachings and advantages of the exemplary embodiments. Accordingly, all such modifications are intended to be included within the scope of the claims. Exemplary embodiments are defined by the following claims, with equivalents of the claims to be included therein.

What is claimed is:

1. A method of forming a photomask, the method comprising:
    providing one-dimensional calibration design patterns each having first design measures and providing two-dimensional calibration design patterns each having second design measures;
    obtaining one-dimensional calibration measured patterns using the one-dimensional calibration design patterns and obtaining two-dimensional calibration measured patterns using the two-dimensional calibration design patterns;
    obtaining first measured measures of the one-dimensional calibration measured patterns and obtaining second measured measures of the two-dimensional calibration measured patterns;
    establishing a correlation between the first measured measures and the second measured measures; and
    converting, using a computer system, a main measured measure of a main pattern into a corresponding one of the first measured measures using the correlation.

2. The method as claimed in claim 1, further comprising, after converting the main measured measure of the main pattern into the corresponding one of the first measure measures:
    obtaining a mean-to-target (MTT) of the main pattern; and
    correcting the main pattern using the MTT of the main pattern.

3. The method as claimed in claim 2, wherein obtaining the MTT of the main pattern comprises:
    selecting the one-dimensional calibration measured pattern and the one-dimensional calibration design pattern based on the first measured measure into which the main measured measure of the main pattern is converted;
    calculating a difference between the first design measures of the one-dimensional calibration design pattern and the first measured measures of the one-dimensional calibration measured pattern; and
    establishing the difference as the MTT of the main pattern.

4. The method as claimed in claim 1, wherein the first design measures and the second design measures vary correspondingly to each other.

5. The method as claimed in claim 1, wherein calculating the correlation comprises:
    calculating a correlation between square roots of the first measured measures and the second measured measures.

6. The method as claimed in claim 1, wherein converting the main measured measure of the main pattern into the corresponding one of the first measured measures using the correlation comprises:
    measuring the main measured measure of the main pattern;
    substituting the main measured measure of the main pattern to the correlation as the second measured measures; and
    calculating the first measured measure corresponding to the main measured measure using the correlation.

7. The method as claimed in claim 1, wherein converting the main measured measure of the main pattern into the corresponding one of the first measured measures using the correlation comprises:
    measuring the main measured measure of the main pattern;
    selecting the two-dimensional calibration measured pattern having the second measured measure corresponding to the main measured measure of the main pattern;
    selecting the one-dimensional calibration measured pattern corresponding to the selected two-dimensional calibration measured pattern using the correlation; and
    converting the main measured measure into the first measured measure of the selected one-dimensional calibration measured pattern.

8. The method as claimed in claim 7, wherein selecting the two-dimensional calibration measured pattern having the second measured measure corresponding to the main measured measure of the main pattern comprises:
    selecting the two-dimensional calibration measured pattern having the second measured measure that is the same as the main measured measure.

9. The method as claimed in claim 7, wherein selecting the two-dimensional calibration measured pattern having the second measured measure corresponding to the main measured measure of the main pattern comprises:
    selecting the two-dimensional calibration measured pattern having the second measured measures that is proximal to the main measured measure.

10. The method as claimed in claim 1, wherein the correlation is a continuous function or a discontinuous relationship between the first measured measures and the second measured measures.

11. The method as claimed in claim 1, wherein the first design measures change by a constant amount.

12. The method as claimed in claim 1, wherein the second design measures change by a constant amount.

13. The method as claimed in claim 1, wherein converting the main measured measure into the first measured measure comprises:
    converting a square root of the main measured measure into the first measured measure.

14. The method as claimed in claim 1, wherein providing the one-dimensional calibration design patterns comprises:
    providing first one-dimensional calibration design patterns extending in a first direction and second one-dimensional calibration design patterns extending in a second direction, the first direction being at a predetermined angle with respect to the first direction.

15. A method of forming a photomask, the method comprising:
    calculating a correlation between one-dimensional calibration patterns and two-dimensional calibration patterns; and
    obtaining a mean-to-target (MTT) of one of the one-dimensional calibration patterns corresponding to a MTT of a main pattern using the correlation; and
    correcting the main pattern using the MTT of one of the one-dimensional calibration patterns,
    wherein at least one of the calculating, obtaining and correcting is performed on a computer system.

16. A method of forming a photomask, the method comprising:
    obtaining first measurements of a one-dimensional calibration pattern including a plurality of one-dimensional designs, the plurality of one-dimensional designs being step-wise different from each other by a predetermined amount;

obtaining second measurements of a two-dimensional calibration pattern including a plurality of two-dimensional designs, the plurality of two-dimensional designs being step-wise different from each other by the predetermined amount;

determining a correlation between the first measurements and the second measurements; and converting, using a computer system, a main measurement of a main pattern into a corresponding one of the first measurements based on the determined correlation.

17. The method as claimed in claim 16, wherein corresponding ones of the one-dimensional designs and the two-dimensional designs have a same length.

18. The method as claimed in claim 17, wherein the one-dimensional designs include at least one line and/or space pattern, and the two-dimensional designs include square patterns.

19. The method as claimed in claim 16, wherein the predetermined amount is a constant.

20. The method as claimed in claim 16, wherein the plurality of one-dimensional designs include first one-dimensional designs extending in a first direction, and second one-dimensional designs extending in a second direction, and the plurality of two-dimensional designs include portions extending in the first direction and portions extending in the second direction, the first direction being at a predetermined angle relative to the second direction.

* * * * *